(12) United States Patent
Meng et al.

(10) Patent No.: US 8,017,175 B2
(45) Date of Patent: Sep. 13, 2011

(54) MANUFACTURING MULTILAYER CONJUGATE POLYMER OPTOELECTRONICS DEVICE BY USING BUFFER LAYER

(75) Inventors: Hsin-Fei Meng, Hsinchu (TW);
Sheng-Fu Horng, Hsinchu (TW);
Chain-Shu Hsu, Hsinchu (TW);
Shi-Cheng Lin, Fengshan (TW);
Hua-Hsien Liao, Taichung (TW)

(73) Assignee: National Chiao Tung University, Hsinchu (TW)

( * ) Notice: Subject to any disclaimer, the term of this patent is extended or adjusted under 35 U.S.C. 154(b) by 1379 days.

(21) Appl. No.: 11/313,043

(22) Filed: Dec. 20, 2005

(65) Prior Publication Data

US 2007/0111006 A1    May 17, 2007

(30) Foreign Application Priority Data

Nov. 11, 2005 (TW) .............................. 94139599 A

(51) Int. Cl.
*B05D 5/06* (2006.01)
(52) U.S. Cl. ........................................................ 427/74
(58) Field of Classification Search ............... 427/74; 136/243, 254
See application file for complete search history.

(56) References Cited

U.S. PATENT DOCUMENTS

| | | | |
|---|---|---|---|
| 6,335,775 B1 * | 1/2002 | Iwamura et al. ............... 349/125 |
| 6,972,431 B2 * | 12/2005 | Forrest et al. .................... 257/40 |
| 7,247,346 B1 * | 7/2007 | Sager et al. .................... 427/162 |
| 2004/0062930 A1 * | 4/2004 | Roberts et al. ............. 428/411.1 |
| 2006/0099731 A1 * | 5/2006 | Buckley et al. ................. 438/99 |

FOREIGN PATENT DOCUMENTS

WO    WO/2004/036663    *    4/2004

OTHER PUBLICATIONS

Multi-colour organic light-emitting displays by solution processing C. David Muller, Aurélie Falcou, Nina Reckefiiss, Markus Rojahn, Valerie Wiederhirn, Paula Rudati, Holger Frobne, Oskar Nuyken, Heinrich Becker, Klaus Meerholz, Nature, 421, 829-833 (Feb. 20, 2003), Letters to Nature.
Polymer multilayer systems for electronic applications Kruger, H.; Wedel, A.; Janietz, S. pp. 267-271.
Interfacial Microstructure Function in Organic Light-Emitting Diodes: Assembled Tetraaryldiamine and Copper Phthalocyanine Interlayers Advanced Materials, vol. 14, Issue 8, Date: Apr. 2002, pp. 565-569, J. Cui, Q. Huang, J.GC. Veinot, H. Yan, I.J. Marks.
Enhanced Polymer Light-Emitting Diode Performance Using a Crosslinked Network Electron-Blocking Interlayer Advanced Materials, vol. 16, Issue 21, Date: Nov. 2004, pp. 1948-1953, H. Yan, B. J. Scott, Q. Huang, I. J. Marks.

* cited by examiner

*Primary Examiner* — Timothy Meeks
*Assistant Examiner* — Tabassom Tadayyon Eslami
(74) *Attorney, Agent, or Firm* — Bucknam and Archer

(57) ABSTRACT

A highly stable, multilayer organic molecular photoelectric element without interlayer miscibility phenomenon during manufacturing process, and a method for producing multilayer organic molecular photoelectric elements with simplified solution process are disclosed.

14 Claims, 4 Drawing Sheets

MANUFACTURING MULTILAYER CONJUGATE POLYMER OPTOELECTRONICS DEVICE BY USING BUFFER LAYER

FIELD OF THE INVENTION

The present invention is directed to a highly stable multilayer organic molecular photoelectric element, and a method for producing multilayer organic molecular photoelectric elements. Particularly, The present invention provides a highly stable multilayer organic molecular photoelectric element without interlayer miscibility phenomenon during manufacturing process using solution process, and a method for producing multilayer organic molecular photoelectric elements with simplified solution process

DESCRIPTION OF THE RELATED PRIOR ART

The common organic photoelectric elements are formed by disposing an anode made of transparent conductive materials like In-Tin oxide (ITO) on glass substrate, and laminating hole-injection region, hole-transportation region, light-emitting region, electron-transportation region and a cathode in this order. The organic photoelectric elements made thereof emit light by applying direct voltage between anode and cathode.

Organic photoelectric elements are highly attracted due to having many advantages over inorganic ones and the vision as members of next generation photoelectric devices, and have been widely applied to industries like semiconductor, flexible electronic application, plastic IC, illumination facility, flat-panel display, and television as full-color organic light-emission displays, backlight modules for mobile phones, flexible electronic products, flexible electronic ICs, and panels for automobiles or flat-panel TVs.

Further, organic photoelectric elements are divided, depending on the molecular size of raw materials, into organic molecular and small molecular ones. The supply of small molecular photoelectric elements is dominated by Asian countries like Japan, Korea, etc.; on the other hand, organic molecular organic photoelectric elements is dominated by the western countries. In addition, for the production methods of organic photoelectric elements, the production of small molecular organic photoelectric elements is generally based on vapor-deposition, and as to the production for organic molecular organic photoelectric elements, spin-coating is usually be used.

Although it is known that vapor-deposition process is capable of producing multilayer small molecular organic photoelectric elements easily, it does not suitable to organic photoelectric elements or devices with larger area. On the contrary, the manufacturing process of organic molecular organic photoelectric elements is simpler and cheaper in the production for the elements with small molecule and thereby it is suitable to produce the photoelectric elements with larger area. On the other hand, it is possible to produce organic molecular organic photoelectric elements with simpler spin-coating. However, it is also known that using organic molecules in the production of multilayer structure leads a serious problem, interlayer miscibility phenomenon. Thus the current-produced organic molecular organic photoelectric elements do not satisfy the simplicity and stability of production required by photoelectrics industry.

To eliminate the above difficulty in the production of multilayer organic photoelectric elements, and solve the problem of miscibility in organic molecules, there are various solutions, e.g., Documents 1 to 4, proposed in the prior art. Document 1 discloses a method directing to the changing of the solubility of light-emitting materials themselves, i.e., organic molecular materials are applied on glass substrate by spin coating, baked under heating, and agglomerated by irradiating with UV lamp to be insoluble; then, the above steps are repeated to obtain multilayer elements; and multilayer organic elements are produced by further vapor-deposition and packaging. However, the method disclosed in Document 1, since the processing depends on chemistry of the materials, it thus is suffered from the limitation in the design of organic molecular structure and the inability of making significant modification.

In addition, the methods disclosed in Documents 2 and 4 are also directing to the changing of the solubility of light-emitting materials themselves, i.e., organic molecular materials are applied on glass substrate by spin coating, subjected to heat treatment to agglomerate to be insoluble; then, the above steps are repeated to obtain multilayer elements; and multilayer organic elements are produced by further vapor-deposition and packaging. Compared to that in Document 1, since the methods disclosed in Documents 2 and 4 also process on chemistry of the materials, they thus are similarly suffered from the limitation in the design of organic molecular structure and the inability of making significant modification.

Furthermore, the methods disclosed in Document 3 are still directing to the changing of the solubility of light-emitting materials themselves, i.e., organic molecular materials are doped with metals, applied on glass substrate by spin coating, and baked by heat to form films; then, the above steps are repeated to obtain multilayer elements; and multilayer organic elements are produced by further vapor-deposition and packaging. The method disclosed in Document 3 still processes in accordance with chemistry of the materials, it thus is suffered from the limitation in the design of organic molecular structure and the inability of making significant modification, as mentioned above.

Therefore, a highly stable, multilayer organic molecular photoelectric element without interlayer miscibility phenomenon during manufacturing process, and a method for producing multilayer organic molecular photoelectric elements with simplified solution process, have been demanded.

[Document 1] Multi-colour organic light-emitting displays by solution processing C. David Muller, Aur?lie Falcou, Nina Reckefuss, Markus Rojahn, Valurie Wiederhirn, Paula Rudati, Holger Frohne, Oskar Nuyken, Heinrich Becker, Klaus Meerholz, Nature, 421, 829-833 (20 Feb. 2003), Letters to Nature.

[Document 2] Polymer multilayer systems for electronic applications Krüger, H.; Wedel, A.; Janietz, S. pp. 267-271.

[Document 3] Interfacial Microstructure Function in Organic Light-Emitting Diodes: Assembled Tetraaryldiamine and Copper Phthalocyanine Interlayers Advanced Materials, Volume 14, Issue 8, Date: April, 2002, Pages: 565-569, J. Cui, Q. Huang, J. G. C. Veinot, H. Van, T. J. Marks.

[Document 4] Enhanced Polymer Light-Emitting Diode Performance Using a Crosslinked-Network Electron-Blocking Interlayer Advanced Materials, Volume 16, Issue 21, Date: November, 2004, Pages: 1948-1953, H. Yan, B. J. Scott, Q. Huang, T. J. Marks.

SUMMARY OF THE INVENTION

In view of the above situations, the objects of the present invention are to provide a highly stable multilayer organic molecular photoelectric element, and a method for producing multilayer organic molecular photoelectric elements.

Therefore, the present inventors have extensively studied on the method for producing multilayer organic molecular photoelectric elements, and found that the above problem is solved by using a highly stable multilayer organic molecular photoelectric element with following composition, thereby completed the present invention.

That is, the present invention provides a method for producing multilayer organic molecular photoelectric elements comprising:
(1) a step of applying a solution comprising organic an molecule A on a clean, transparent substrate made of glass or plastic, to form a layer of organic molecule A;
(2) a step of applying a solution comprising a buffer agent on the layer of organic molecule A, to form a non-permanent buffer layer;
(3) a step of applying a solution comprising an organic molecule B on the non-permanent buffer layer, to form a layer of organic molecule B;
(4) optionally, a step of removing the non-permanent buffer layer; and
(5) repeating steps (2), (3) and (4) to obtain a photoelectric element with two or more layers of organic molecules.

Further, the present invention provides a multilayer organic molecular photoelectric element capable of being used in liquid crystal displaying elements or liquid crystal displays.

DETAILED DESCRIPTION OF THE INVENTION

The method for producing multilayer organic molecular photoelectric elements according to the present invention is usable to produce any film with two or more layers of organic molecules made by solution process. The so-called "solution process" is directing to a process wherein organic molecular material is uniformly dissolved in a solvent to be the form of liquid and applied to a substrate by coating or ink-jetting, and an organic molecular layer is formed after the solvent is vaporized.

Figure 1:
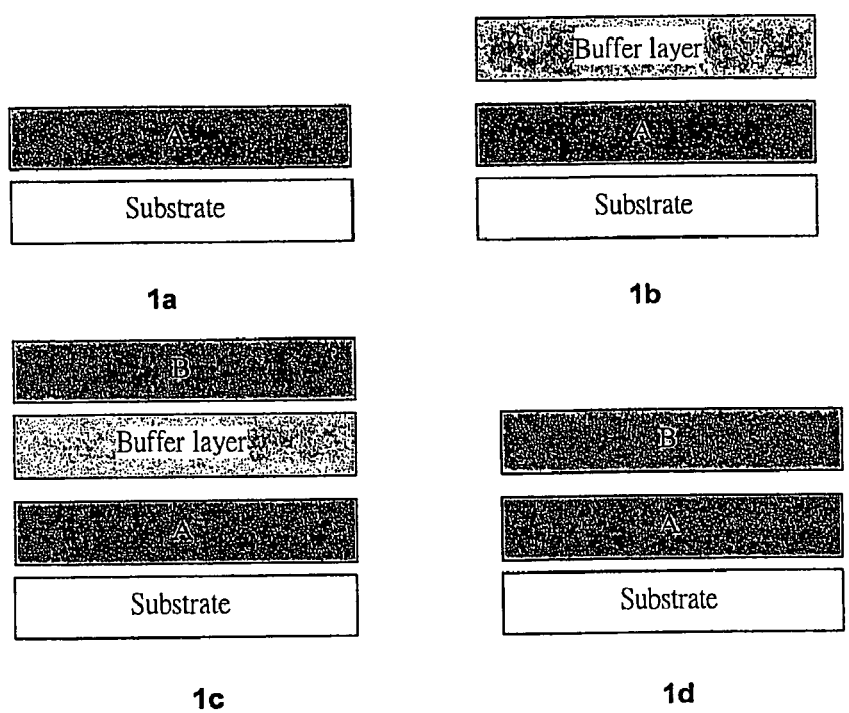
FIG. 1 is a schematic view showing a method for producing multilayer photoelectric elements according to the present invention.

The method according to the present invention is described as below referring to the accompanying figures. For example, FIGS. 1a to 1d are schematic views showing manufacturing processes for producing two-layer organic molecular elements by the method according to the present invention. First, according to the present method for producing multilayer organic molecular photoelectric elements, a layer of organic molecule A is formed on a substrate as shown in FIG. 1a; then a non-permanent buffer layer for preventing a solution comprising an organic molecule B to damage thereon is formed on the layer of organic molecule A as shown in FIG. 1b. Subsequently, a layer of organic molecule B is formed on the buffer layer as shown in FIG. 1c, and then the non-permanent buffer layer is removed, so that the layer of organic molecule B is formed on the layer of organic molecule A without damaging thereto, and on the substrate a film or element comprising the layers of organic molecules A and B are successfully obtained as shown in FIG. 1d. Therefore, according to the present method, there are layer of organic molecule A, non-permanent buffer layer, layer of organic molecule B formed on the substrate in this order, and the non-permanent buffer layer is removed later to form the film or element comprising the layers of organic molecules A and B.

Likely, according to the present method for producing two-layer organic molecular photoelectric element shown in FIGS. 1a to 1d, those with more than two layers can be produced. Concretely, the process shown in FIGS. 1a-1d are repeated so that film or element comprising two or more layers of organic molecules are made by forming a non-permanent buffer layer on an organic molecular layer, and forming another organic molecular layer thereon, then removing the buffer layer. Further, according to the present method, film or element comprising three or more layers of organic molecule A, organic molecule B, organic molecule C, . . . are made by consequentially forming layer of organic molecule A, non-permanent buffer layer, layer of organic molecule B, non-permanent buffer layer, layer of organic molecule C, . . . then removing each buffer layer. Therefore, the present method is usable to produce any photoelectric film or element with two or more layers of organic molecules, as necessary, and made by solution process.

In addition, the transparent substrate usable in multilayer organic molecular photoelectric element according to the present method is, for example, glass, or soft film selected from any one of polycarbonates, polyether-sulfones, polymethacrylates or poly-triacetyl celluloses, and the like.

Any organic molecule and small molecule materials can be used in the present invention to form the layers of organic molecules A and B without particular limitation, as long as they are of conjugate conductivity or light-emitting property. For example, there is used substituted or non-substituted aromatic conjugated organic molecules, such as high molecular materials like poly(p-phenylenevinylene) (PPV) based organic molecules, poly(p-phenyleneethylene) (PPE) based organic molecules, polyfluorene based organic molecules, polythiophene based organic molecules, polypyrrole based organic molecules and the like, or copolymer comprising any of the combination thereof as units. Further, small molecules having conjugate conductivity or light-emitting property can be anthracene, pentacene, phenanthrene, rubrene, 2,3-benzanthracene, perylene, 9,10-phenanthreneaquinone, triphenylene, 1,1,4,4-tetraphenyl-1,3-butadiene, N,N'-di[(1-naphthyl)-N,N'-diphenyl]-1,1'-biphenyl-4,4'-diamine (NPD), titanyl phthalocyanine, 4,4',4''-tris(N-(naphthylene-2-yl)-N-phenylamino)triphenylamine (2-TNATA), N,N'-bis(4-methyl phenyl)-N,N'-bis(phenyl)-1,4-phenylenediamine, triphenylamine, tri-p-tolylamine, tris(4-(diethylamino)phenyl)amine, N,N'-diphenyl benzidine, 2-(4-biphenylyl)-5-phenyl-1,3,4-oxadiazole (PBD), 2,5-diphenyl-1,3,4-oxadiazole, 5-(4-pyridyl)-1,3,4-oxadiazole-2-thiol, 2-(4-bromophenyl)-5-phenyl-1,3,4-oxadiazole, 2,5-bis(4-aminophenyl)-1,3,4-oxadiazole, 5-phenyl-1,3,4-oxadiole-2-thiol, 2,1,3-benzoxadiazole-5-carboxylic acid, 5-(4-methoxyphenyl)-1,3,4-oxadiazole-2-thiol, 7,7,8,8-tetracyanoquino dimethane (TCNQ), tetracyanoethylene (TCNE), perfluorotetracyano quinolyldimethane (TCNQF4), 2-[4-((bis(2-hydroxyethyl)aminophenyl)-cyanomethylene)-2,5-cyclohexadien-1-yldiene]malo nitrile; and/or metal complexes such as tri-(8-hydroxyquinolinoato)aluminum (AlQ3), 8-hydroxyquinoline zinc salts (ZnQ3), N,N-biphenyl-N,N-bis-3-methylphenyl-1,1- biphenyl- 4,4-diamine (TPD), 4,4'-bis(9-carbazolyl)-2,2'-biphenyl (CBP), and the like.

Additionally, there is no particular limitation on the materials used as buffer layers in the present invention, as long as they do not deteriorate the properties of the layers of organic molecules. However, it is preferred to use those do not dissolve the layers of organic molecule A. Preferred buffer agents are alcoholic or alkane solutions which do not dissolve organic molecules, for example, 1,2-propylene glycol, ethanol or glycerine, and the like.

Further, in view of performing the effects of the present invention, it is preferable that the molecular weight of the buffer agent is less than 2000. In addition, in view of the operational ease and effects of the present invention, it is preferable that the viscosity of the buffer agent solution (Vbf) is in the range of 10-2000 η/mPas, more preferable 15-1950 η/mPas, and most 20-1900 η/mPas. Besides, in view of the removal ease of the buffer layer, it is also preferable that the boiling point of the buffer agent solution (Tbf) is below 350° C. Also, in view of performing the effects of the present invention, it is preferable the difference (Vbf–VA) between the viscosity of the buffer agent solution (Vbf) and that of the molecule A solution (VA) is in the range of 1-2000 η/mPas, more preferable 5-1900 η/mPas, particularly preferable 10-1800 η/mPas, and most preferable 20-1700 η/mPas.

Furthermore, there is no particular limitation on the morphology of the materials used as the buffer layers in the present method for producing multilayer organic molecular photoelectric elements, and they can be present in the state of liquid or solid. Also, there is no particular limitation on the thickness of the buffer layers as long as it does not deteriorate the effect of the present invention.

EXAMPLES

Firstly, the industrial utilization of the application of buffer layers in the present invention is described.

Reference Example 1

No Buffer Layer

On ITO substrate, BP-79 (trade name, manufactured by Dow Chemicals) dope (concentration: 2 wt %, solvent: xylene) was applied and dried on 120° C. hot plate for 1 hour to form a film with a thickness of about 1500 Å, as measured by thickness meter ET-4000. With the same procedures, xylene organic solvent was spin-coated on BL layer, and the residual film thickness was measured about 100 Å. It is found BP-79 high molecular layer was dissolved off about 1400 Å when organic solvent (e.g. xylene) was spin-coated directly thereon.

Reference Example 2

Alkane Buffer Layer

Similar to Reference Example 1, BP-79 high molecular layer with thickness indicated in Table 1, as measured by thickness meter ET-4000, was formed on ITO substrate. Subsequently, buffer agents indicated in Table 1 were spin-coated on the film of BP-79 high molecular layer respectively as described above and dried under heating to form a buffer layer (BL). Then, xylene organic solvent was spin-coated on BL layer, and the residual film thickness thereof were measured as described above to observe the protection effect of buffer layer on the first light-emitting layer.

TABLE 1

| T0 (Å) | 1720 | 1600 | 1700 |
|---|---|---|---|
| Alkane buffer agent | Octane (C8) | Decane (C10) | Octadecane (C18) |
| T1 (Å) | 630 | 550 | 610 |
| Dissolved thickness (T0-T1) (Å) | 1090 | 1050 | 1090 |
| Dissolution ration (%) | 63% | 66% | 64% |

T0: initial thickness of BP-79 high molecular layer; T1: residual thickness of light-emitting layer after applying xylene.

From Table 1, it is known that BP-79 high molecular light-emitting layers with alkanes as buffer layers in Reference Example 2 were dissolved off about 1000-1150 Å, which was smaller than 1400 Å in Reference Example 1. Therefore, Reference Example 2 in which buffer layer was used is of protection effect over Reference Example 1 without buffer layer.

Reference Example 3

Alcoholic Buffer Layer

The same procedures as in Reference Example 2 were used, with the exception that alkane buffer agents in Reference Example 2 were replaced with alcoholic buffer agents indicated in Table 2, BP-79 high molecular layer, buffer layer and xylene organic solvent layer were formed on ITO substrate, and the film thickness thereof, as measured by thickness meter ET-4000, are shown in Table 2.

TABLE 2

| T0 (Å) | 2140 |
|---|---|
| Alcoholic buffer agent | Glycerin |
| T1 (Å) | 2140 |
| Dissolved thickness (T0-T1) (Å) | 0 |
| Dissolution ration (%) | 0% |

From Table 2, it is known that BP-79 high molecular light-emitting layers with alcoholics as buffer layer in Reference Example 3 were dissolved off about 950-1100 Å, which was smaller than 1400 Å of Reference Example 1. Therefore, Reference Example 3 in which buffer layer was used is also of protection effect over Reference Example 1 without buffer layer.

Accordingly, it is known from the results of Reference Examples 1-3 that, using "buffer layer" in the method for producing multilayer organic molecular elements with simplified solution process, in accordance with the technical concept of the present invention, is capable of effectively solving the problem of interlayer miscibility found in prior art.

The examples of the present invention are described below, however, the present invention is not limited thereto.

Example 1

Preparation of Dope for Layer of Organic Molecule A

Poly(9,9-dioctanylfluorene) (trade name: ADS129BE, manufactured by American Dye Corp., molecular weight: 40000-120000) was dissolved in p-xylene (boiling point: 138.37° C.) or toluene (boiling point: 110.63° C.) to prepare dope for layer of organic molecule A (PFO solution) with a concentration of 2 wt %.

<Preparation of Dope for Buffer Layer>

1,2-propylene glycol, which boiling point is 187.6° C., molecular weight is 76.095 g/mol, viscosity is 248 η/mPas at 0° C. and 40.0 η/mPas at 25° C., was used as dope for buffer layer.

<Preparation of Dope for Layer of Organic Molecule B>

1,3,5-cis-(N-phenyl benzoimidazol-2-yl)benzene (TPBI) was dissolved in toluene (boiling point: 110.63° C.) to prepare dope for layer of organic molecule B with a concentration of 2 wt %.

<Preparation of Photoelectric Element Comprising Layers of Organic Molecules A and B>

Anodic and cathodic regions were defined by photolithography on ITO substrate. Then, poly(3,4-ethylenedioxythiophene) poly(styryl sulfonate) (PEDOT) was applied on the ITO substrate by spin-coating to form a film with a thickness of 40 nm. It was heated to 200° C. under vacuum ($10^{-3}$ torr) for 5 minutes after spin-coating and then annealed for 15 minutes.

Next, PFO solution obtained above was applied on PEDOT by spin-coating to form a film with a thickness of 60 nm. It was heated to 120° C. under vacuum ($10^{-3}$ torr) for 40 minutes after spin-coating and then annealed for 15 minutes.

Then, propylene glycol was spin-coated on PFO film for about 1 second, and immediately TPBI was applied on the buffer layer while it was still liquid and protected the original PFO film. It was heated to 120° C. under vacuum ($10^{-3}$ torr) for 1 hour after spin-coating and then annealed for 15 minutes to remove solvent in buffer layer. Thereafter, the element obtained above was put into glove box for sequential thermal vapor-deposition of calcium, aluminum electrodes and packaging.

Figure 2:
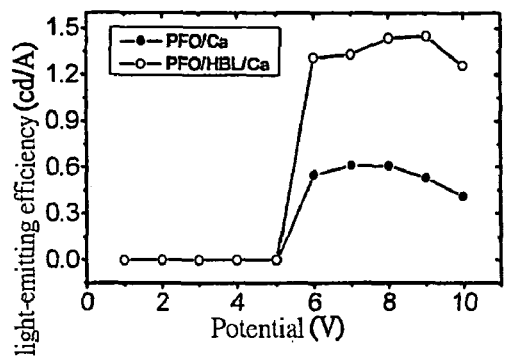
FIG. 2 is a graph showing the relationship between potential and current light-emitting efficiency of a photoelectric element produced in Example 1 according to method of the present invention.
Figure 3:
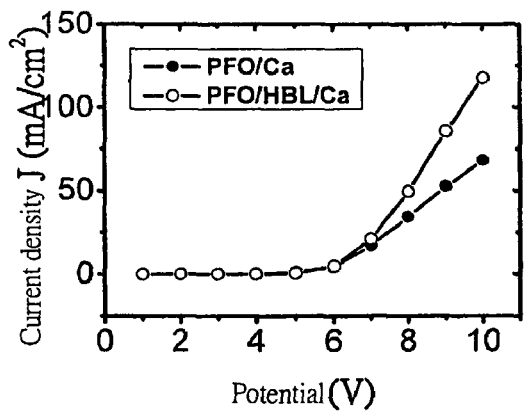
FIG. 3 is a graph showing the relationship between potential and current density of a photoelectric element produced in Example 1 according to method of the present invention.

Subsequently, the voltage-current characters of the above-obtained photoelectric element was measured by Keithley 2400 current-voltage meter, the optical characters as spectrum, illuminance, light-emitting efficiency, and CIE coordinates were measured by PR650; and the integrated electrical and optical property was measured by Keithley 2400 current-voltage meter combining with computer program. Further, photoelectric performance is shown in FIGS. 2 and 3. From the test results shown in FIGS. 2 and 3 it is known that, elements with two-layer PFO (comprising hole-blocking layer TPBI) performed over those with single layer PFO. Accordingly, the present invention is effective usable in the production of multilayer photoelectric elements.

Example 2

Preparation of Dope for Layer of Organic Molecule A

Poly[2-methoxy-5-(2'-ethylhexyloxy)-1,4-phenylenevinylene] (trade name: ADS100RE, manufactured by American Dye Corp., molecular weight: >500000) was dissolved in p-xylene (boiling point: 138.37° C.) or toluene (boiling point: 110.63° C.) to prepare dope for layer of organic molecule A (MEH-PPV solution) with a concentration of 2 wt %.

<Preparation of Dope for Buffer Layer>

1,2-propylene glycol, which boiling point is 187.6° C., molecular weight is 76.095 g/mol, viscosity is 248 η/mPas at 0° C. and 40.0 η/mPas at 25° C., was used as dope for buffer layer.

<Preparation of Dope for Layer of Organic Molecule B>

LUMATION*BP105 (trade name, manufactured by Dow Chemicals, Ip: 5.8 eV, boiling point: 138.37° C.) was dissolved in p-xylene to prepare dope for layer of organic molecule B with a concentration of 2 wt %.

<Preparation of Photoelectric Element Comprising Layers of Organic Molecules A and B>

Anodic and cathodic regions were defined by photolithography on ITO substrate. Then, poly(3,4-ethylenedioxythiophene) poly(styryl sulfonate) (PEDOT) was applied on the ITO substrate by spin-coating to form a film with a thickness of 40 nm. It was heated to 200° C. under vacuum ($10^{-3}$ torr) for 5 minutes after spin-coating and then annealed for 15 minutes.

Next, MEH-PPV solution obtained above was applied on PEDOT by spin-coating to form a film with a thickness of 50 nm. It was heated to 120° C. under vacuum ($10^{-3}$ torr) for 40 minutes after spin-coating and then annealed for 15 minutes.

Then, propylene glycol was spin-coated on MEH-PPV film for about 1 second, and immediately TPBI was applied on the buffer layer while it was still liquid and protected the original MEH-PPV film. It was heated to 120° C. under vacuum ($10^{-3}$ torr) for 1 hour after spin-coating and then annealed for 15 minutes to remove solvent in buffer layer. Thereafter, the element obtained above was put into glove box for sequential thermal vapor-deposition of calcium, aluminum electrodes and packaging.

Figure 4:
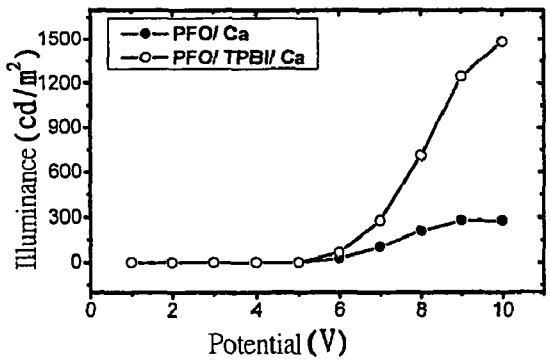
FIG. 4 is a graph showing the relationship between potential and illuminance of a photoelectric element produced in Example 1 according to method of the present invention.
Figure 5:
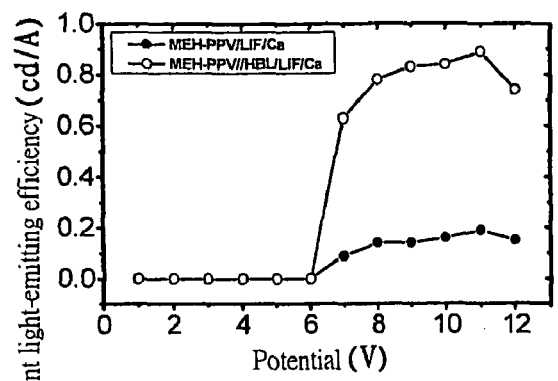
FIG. 5 is a graph showing the relationship between potential and current light-emitting efficiency of a photoelectric element produced in Example 2 according to method of the present invention.

Subsequently, the voltage-current characters of the above-obtained photoelectric element was measured by Keithley 2400 current-voltage meter, the optical characters as spectrum, illuminance, light-emitting efficiency, and CIE coordinates were measured by PR650; and the integrated electrical and optical property was measured by Keithley 2400 current-voltage meter combining with computer program. Further, photoelectric performance is shown in FIGS. 4 and 5. From the test results shown in FIGS. 4 and 5 it is known that, elements with two-layer MEH-PPV (comprising hole-blocking layer BP105) performed over those with single layer MEH-PPV. Accordingly, the present invention is effective usable in the production of multilayer photoelectric elements.

Example 3

Preparation of Dope for Layer of Organic Molecule A

Poly[(2-(4-(3,7-dimethyloctyloxy)phenyl)-3-phenyl-1,4-phenylenevinylene)-co-(2,5-dimethyl-1,4-phenylenevinylene)] (DPOC10-DOMe-PPV) (EA=3.2, IP=5.6) was dissolved in p-xylene (boiling point: 138.37° C.) or toluene (boiling point: 110.63° C.) to prepare dope for layer of organic molecule A (DPOC10-DOMe-PPV solution) with a concentration of 2 wt %.

<Preparation of Dope for Buffer Layer>

1,2-propylene glycol, which boiling point is 187.6° C., molecular weight is 76.095 g/mol, viscosity is 248 η/mPas at 0° C. and 40.0 η/mPas at 25° C., was used as dope for buffer layer.

<Preparation of Dope for Layer of Organic Molecule B>

1,3,5-cis-(N-phenyl benzoimidazol-2-yl)benzene (TPBI) was dissolved in toluene (boiling point: 110.63° C.) to prepare dope for layer of organic molecule B with a concentration of 2 wt %.

<Preparation of Photoelectric element Comprising Layers of Organic Molecules A and B>

Anodic and cathodic regions were defined by photolithography on ITO substrate. Then, poly(3,4-ethylenedioxythiophene) poly(styryl sulfonate) (PEDOT) was applied on the ITO substrate by spin-coating to form a film with a thickness of 40 nm. It was heated to 200° C. under vacuum ($10^{-3}$ torr) for 5 minutes after spin-coating and then annealed for 15 minutes.

Next, DPOC10-DOMe-PPV solution obtained above was applied on PEDOT by spin-coating to form a film with a thickness of 60 nm. It was heated to 120° C. under vacuum ($10^{-3}$ torr) for 40 minutes after spin-coating and then annealed for 15 minutes.

Then, propylene glycol was spin-coated on DPOC10-DOMe-PPV film for about 1 second, and immediately TPBI was applied on the buffer layer while it was still liquid and protected the original DPOC10-DOMe-PPV film. It was heated to 120° C. under vacuum ($10^{-3}$ torr) for 1 hour after spin-coating and then annealed for 15 minutes to remove solvent in buffer layer. Thereafter, the element obtained above was put into glove box for sequential thermal vapor-deposition of calcium, aluminum electrodes and packaging.

Figure 6:
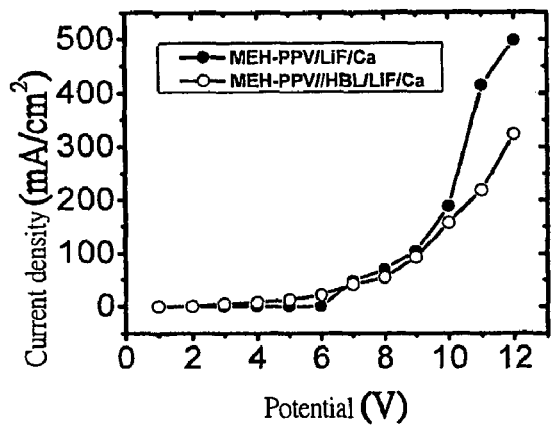
FIG. 6 is a graph showing the relationship between potential and current density of a photoelectric element produced in Example 2 according to method of the present invention.
Figure 7:
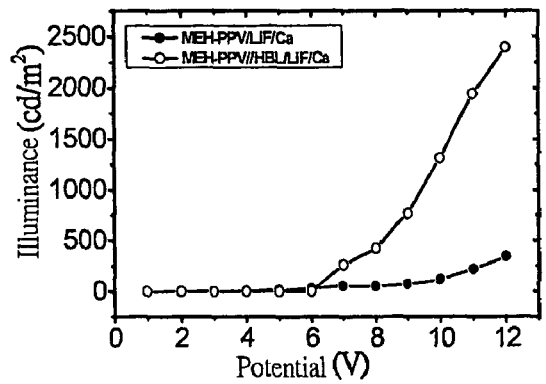
FIG. 7 is a graph showing the relationship between potential and illuminance of a photoelectric element produced in Example 2 according to method of the present invention.
Figure 8:
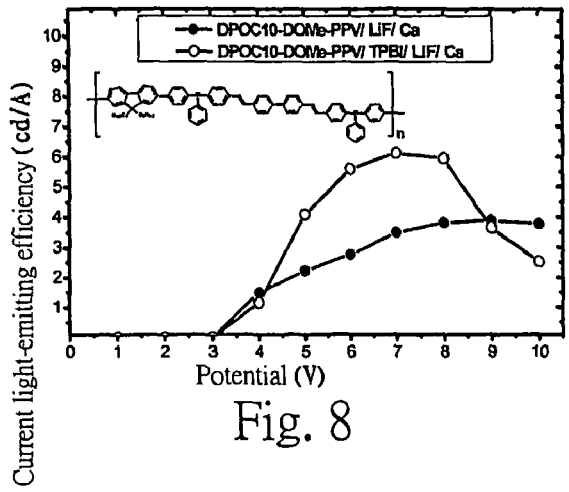
FIG. 8 is a graph showing the relationship between potential and current light-emitting efficiency of a photoelectric element produced in Example 3 according to method of the present invention. The structure shown in the graph is DPOC10-DOMe-PPV.
Figure 9:
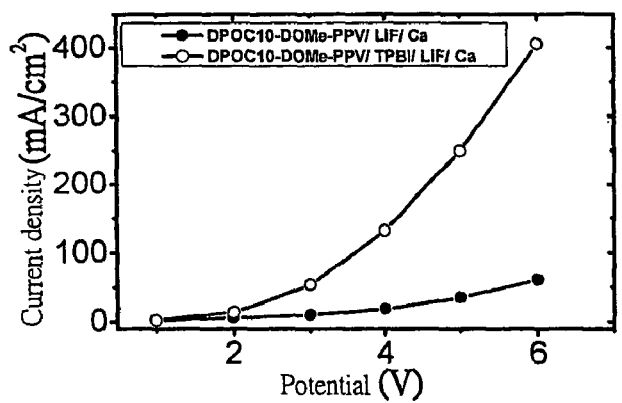
FIG. 9 is a graph showing the relationship between potential and current density of a photoelectric element produced in Example 3 according to method of the present invention. The structure shown in the graph is DPOC10-DOMe-PPV.
Figure 10:
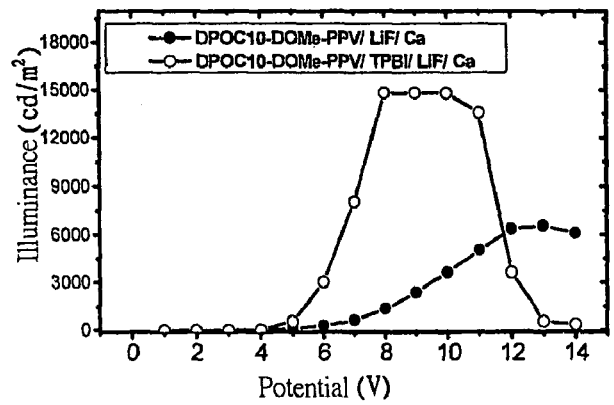
FIG. 10 is a graph showing the relationship between potential and illuminance of a photoelectric element produced in Example 3 according to method of the present invention.

Subsequently, the voltage-current characters of the above-obtained photoelectric element was measured by Keithley 2400 current-voltage meter, the optical characters as spectrum, illuminance, light-emitting efficiency, and CIE coordinates were measured by PR650; and the integrated electrical and optical property was measured by Keithley 2400 current-voltage meter combining with computer program. Further, photoelectric performance is shown in FIGS. 6 and 7. From the test results shown in FIGS. 6 and 7 it is known that, elements with two-layer DPOC10-DOMe-PPV (comprising hole-blocking layer TPBI) performed over those with single layer DPOC10-DOMe-PPV. Accordingly, the present invention is effective usable in the production of multilayer photoelectric elements.

Inventive Effects

It is known from the results of the above Examples that, using the inventive buffer layer in the method for producing multilayer organic molecular elements with simplified solution process, in accordance with the technical concept of the present invention, is capable of effectively solving the problem of interlayer miscibility found in prior art.

We claim:

1. A method for producing a multilayer organic molecular photoelectric element comprising:
   (1) a step of applying a solution comprising organic molecules A on a clean, transparent substrate made of glass or plastic, to form a layer of organic molecule A;
   (2) a step of applying an alcohol or alkane solution that does not dissolve organic molecules comprising a buffer agent on the layer of organic molecule A, to form a non-permanent buffer layer;
   (3) a step of applying a solution comprising organic molecule B on the non-permanent buffer layer, to form a layer of organic molecule B; and
   (4) a step of entirely removing the non-permanent buffer layer by drying, whereby the resulting multilayer organic molecular photoelectric element consists of a transparent substrate, a layer of organic molecule A, and layer of organic molecule B.

2. The method for producing a multilayer organic molecular photoelectric elements element as described in claim 1, wherein the transparent substrate is glass, or soft film selected from the group consisting of polycarbonates, polyether-sulfones, polymethacrylates and poly-triacetyl celluloses.

3. The method for producing a multilayer organic molecular photoelectric elements element as described in claim 1, wherein the organic molecules A and B are aromatic conjugated organic molecules or metal complexes.

4. The method for producing a multilayer organic molecular photoelectric element as described in claim 3, wherein the aromatic conjugated organic molecules are selected from poly(p-phenylenevinylene) (PPV) based organic molecules, poly(p-phenyleneethylene) (PPE) based organic molecules, polyfluorene based organic molecules, polythiophene based organic molecules, polypyrrole based organic molecules, and/or the copolymer formed of any of the combination thereof as units.

5. The method for producing a multilayer organic molecular photoelectric element as described in claim 3, wherein the aromatic conjugated organic molecules are anthracene, pentacene, phenanthrene, rubrene, 2,3-benzanthracene, perylene, 9,10-phenanthrenequinone, triphenylene, 1,1,4,4-tetraphenyl-1,3-butadiene, N,N'-di[(1-naphthyl)-N,N'-diphenyl]-1,1'-biphenyl-4,4'-diamine (NPD), titanyl phthalocyanine, 4,4',4"-tris(N-(naphthylene-2-yl)-N-phenylamino) triphenylamine (2-TNATA), N,N'-bis(4-methylphenyl)-N, N'-bis(phenyl)-1,4-phenylenediamine, triphenylamine, tri-p-tolylamine, tri(4-(diethylamino)phenyl)amine, N,N'-diphenylbrenzidine, 2-(4-biphenylyl)-5-phenyl-1,3,4-oxadiazole (PBD), 2,5-diphenyl-1,3,4-oxadiazole, 5-(4-pyridyl)-1,3,4-oxadiazole-2-thiol, 2-(4-bromo phenyl)-5-phenyl-1,3,4-oxadiazole, 2,5-bis(4-aminophenyl)-1,3,4-oxadiazole, 5-phenyl-1,3,4-oxadiole-2-thiol, 2,1,3-benzoxadiole-5-carboxylic acid, 5-(4-methoxyphenyl)-1,3,4-oxadiole-2-thiol, 7,7,8,8-tetracyanoquinodimethane (TCNQ), tetracyanoethylene (TCNE), perfluorotetracyanoquinolyldimethane (TCNQF4), or 2-[4-((bis(2-hydroxyethyl)aminophenyl)-cyanomethylene)-2,5-cyclohexadien-1-yldiene]malo nitrile.

6. The method for producing a multilayer organic molecular photoelectric element as described in claim 3, wherein the metal complexes are tri-(8-hydroxyquinolinato)aluminum (AlQ3), 8-hydroxyquinoline zinc salts (ZnQ3), N,N-biphenyl-N,N-bis-3-methylphenyl-1,1-biphenyl-4,4-diamine (TPD), 4,4'-bis(9-carbazolyl)-2,2'-biphenyl (CBP), and the like.

7. The method for producing a multilayer organic molecular photoelectric element as described in claim 1, wherein the buffer agent is methanol, ethanol or glycerine.

8. The method for producing a multilayer organic molecular photoelectric elements element as described in claim 1, wherein the molecular weight of the buffer agent (Mbf) is smaller than that of the layer of organic molecule A (MA).

9. The method for producing a multilayer organic molecular photoelectric element as described in claim 1, wherein the molecular weight of the buffer agent (Mbf) is equal to or less than 2000.

10. The method for producing a multilayer organic molecular photoelectric elements element as described in claim 1, wherein the viscosity of the buffer agent solution (Vbf) is higher than that of the molecule A solution (VA).

11. The method for producing a multilayer organic molecular photoelectric element as described in claim 7, wherein the difference (Vbf−VA) between the viscosity of the buffer agent solution (Vbf) and that of the molecule A solution (VA) is in the range of 1-2000 $\eta$/mPas.

12. The method for producing a multilayer organic molecular photoelectric element as described in claim 9, wherein the boiling point of the buffer agent solution (Tbf) is equal to or below 350° C.

13. The method for producing a multilayer organic molecular photoelectric element as described in claim 1, which is usable in the production of liquid crystal displaying elements or liquid crystal displays.

14. The method for producing a multilayer organic molecular photoelectric element as described in claim 1, which, before step (4), further comprises:

a step of applying an alcohol or alkane solution that does not dissolve organic molecules comprising a buffer agent on the layer of organic molecule B, to form a second non-permanent buffer layer; and a step of applying a solution comprising organic molecule C on the second non-permanent buffer layer, to form a layer of organic molecule C, whereby, subsequent to the step of entirely removing the non-permanent buffer layers by drying, the resulting multilayer organic molecular photoelectric element consists of a transparent substrate, a layer of organic molecule A, a layer of organic molecule B, and a layer of organic molecule C.

* * * * *